(12) United States Patent
Weber et al.

(10) Patent No.: US 6,876,283 B1
(45) Date of Patent: Apr. 5, 2005

(54) TAPERED-WIDTH MICRO-CANTILEVERS AND MICRO-BRIDGES

(75) Inventors: Robert J. Weber, Boone, IA (US); Chieh-Hsiao Wang, Hsinchu (TW)

(73) Assignee: Iowa State University Research Foundation, Inc., Ames, IA (US)

( * ) Notice: Subject to any disclaimer, the term of this patent is extended or adjusted under 35 U.S.C. 154(b) by 0 days.

(21) Appl. No.: 10/618,055

(22) Filed: Jul. 11, 2003

(51) Int. Cl.[7] .............................................. H01H 51/22
(52) U.S. Cl. ....................................... 335/78; 200/181
(58) Field of Search .................... 335/78, 80; 361/233; 200/181

(56) References Cited

U.S. PATENT DOCUMENTS

| | | | | |
|---|---|---|---|---|
| 5,367,136 A | * | 11/1994 | Buck | 200/600 |
| 5,578,976 A | * | 11/1996 | Yao | 333/262 |
| 6,307,452 B1 | * | 10/2001 | Sun | 333/262 |
| 6,445,106 B1 | * | 9/2002 | Ma et al. | 310/309 |
| 6,531,668 B1 | * | 3/2003 | Ma | 200/181 |
| 6,535,091 B2 | * | 3/2003 | Bechtle et al. | 333/262 |
| 6,624,720 B1 | * | 9/2003 | Allison et al. | 333/105 |

* cited by examiner

*Primary Examiner*—Lincoln Donovan
*Assistant Examiner*—Bernard Rojas
(74) *Attorney, Agent, or Firm*—Leydig, Voit & Mayer, Ltd.

(57) ABSTRACT

The invention provides tapered-width micro-cantilevers and micro-bridges that give additional design parameters for controlling and synthesizing pull-in (i.e., actuation) voltages. The pull-in voltage of a tapered-width micro-cantilever is generally a function of the taper function of the width along the length, the initial width, and the length of the micro-cantilever. By controlling these design parameters, a specific pull-in voltage for a micro-cantilever is obtained. The formula for a pull-in voltage is determined based on the geometry of the micro-cantilever device and a plurality of derived pull-in voltages. The pull-in voltage is derived by iteratively solving a displacement vector as a function of applied voltage across the micro-cantilever device and setting the pull-in voltage to the voltage at which the solution does not converge. The formula is derived for linear-tapered width, parabolic-tapered width and exponential-tapered width micro-cantilevers.

31 Claims, 12 Drawing Sheets

PRIOR ART

TAPERED-WIDTH MICRO-CANTILEVERS AND MICRO-BRIDGES

FIELD OF THE INVENTION

This invention pertains to microstructures and more particular pertains to micro-cantilevers and micro-bridges.

BACKGROUND OF THE INVENTION

Micro-electromechanical RF/microwave components, such as switches, phase shifters, and passive elements, have been demonstrated to have high performance, low cost, inherently smaller size, and low power consumption. These components include micro-cantilevers and micro-bridges. These components can also be used as sensors by doping or sensitizing a portion of the tip or body of the micro-cantilever, as a tool for DNA replication, as a tool for conductivity measurements, and as probes for multiple uses. For a micro-cantilever to be useful as an actuator such as in an RF switch, the actuation voltage of the micro-cantilever should be as low as possible to be compatible with the voltage sources integrated or combined with the RF circuit in which the switch is used such that additional high voltage sources are avoided.

The pull-in voltage (i.e., actuation voltage) of a simple micro-cantilever as a function of its dimensions and material properties is $$V_{PI} = \sqrt{\frac{2Ed_0^3 t^3}{27\varepsilon_0 L^4}} \quad (1)$$

where E is the Young's modulus, $d_0$ is the initial gap between the micro-cantilever and the actuation electrode, t is the thickness, L is the length of the cantilever, and $\varepsilon_0$ is the permittivity of the air.

Figure 13:
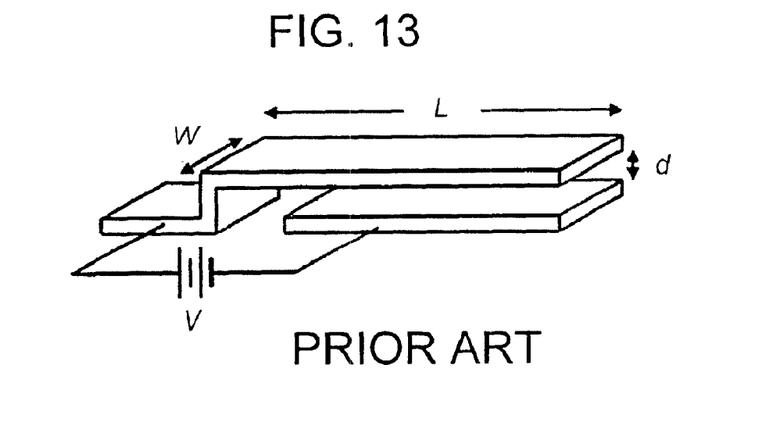
FIG. 13 is an isometric view of a linear micro-cantilever.

From equation 1, it can be seen that the design parameters for a specific pull-in voltage are the dimensions of the micro-cantilever. For a given manufacturing technology where material properties and the initial gap $d_o$ and thickness t are usually fixed, the only design parameter is the length of a cantilever. In order to lower the actuation voltage, one is forced to use long cantilevers as illustrated in FIG. 13 that require a tight control over the stress and stress gradient along the length. The long lengths require a critical point drying process to avoid stiction during the manufacturing process. Stiction occurs when surfaces are pulled together by capillary force when the wet etchant between two layers dries out. Stiction results in the moving portions of the cantilever structure being stuck to the non-moving (e.g., stationary) portions of the cantilever structure.

What is needed, therefore, is a high performance, low cost, low-pull-in voltage micro-cantilever device.

The invention provides such a device. These and other advantages of the invention, as well as additional inventive features, will be apparent from the description of the invention provided herein.

BRIEF SUMMARY OF THE INVENTION

The invention provides tapered-width micro-cantilevers to give more design parameters in design space for controlling and synthesizing their pull-in (actuation) voltages. For a given fabrication process, the pull-in voltage of a micro-cantilever is generally a function of the taper function of width along the length, its initial width, and its length. By controlling these design parameters, a specific pull-in voltage for a micro-cantilever can be obtained. The taper functions include, but are not limited to, linear, parabolic, and exponential tapers. Pull-in voltage as low as 1 V is achieved with a fast growing taper function for a micro-cantilever.

The formula for a pull-in voltage is determined based on the geometry of the micro-cantilever device and a plurality of derived pull-in voltages. The pull-in voltage is computed by iteratively solving a displacement vector as a function of applied voltage across the micro-cantilever device for a particular length and taper function slope or coefficient. The pull-in voltage is set to the voltage at which the solution does not converge. The pull-in voltage is calculated for a series of slopes/coefficients and lengths. Based upon the calculated pull-in voltages, a form of the pull-in voltage formula is assumed and the formula is determined by fitting the assumed form to the plurality of pull-in voltages based upon the geometry of the micro-cantilever device.

Other aspects, objectives and advantages of the invention will become more apparent from the following detailed description when taken in conjunction with the accompanying drawings.

DETAILED DESCRIPTION OF THE INVENTION

The invention provides tapered-width micro-cantilevers that give additional design parameters for controlling and synthesizing pull-in (i.e., actuation) voltages. For a given fabrication process, the pull-in voltage of a micro-cantilever is generally a function of the taper function of width along the length, the initial width, and the length of the micro-cantilever. By controlling these design parameters, a specific pull-in voltage for a micro-cantilever is obtained.

The actuation voltage of a micro cantilever is also a function of the material properties and its geometry. The tapered-width micro-cantilevers of the present invention provide more control of the pull-in voltage than conventional micro-cantilevers by controlling the cantilever geometry. In this way, a width and taper function dependence is introduced into the pull-in voltage control parameters of the micro-cantilever. Although it is difficult to derive the analytical formula for the pull-in voltage of a tapered-width micro-cantilever, an empirical formula is extractable from numerical calculations for virtually any tapered-width function. For a particular taper function, an empirical formula for pull-in voltages as a function of the dimensions of a cantilever can be extracted from the simulation results and can therefore be used to synthesize a desired pull-in voltage of a cantilever.

Figure 1:
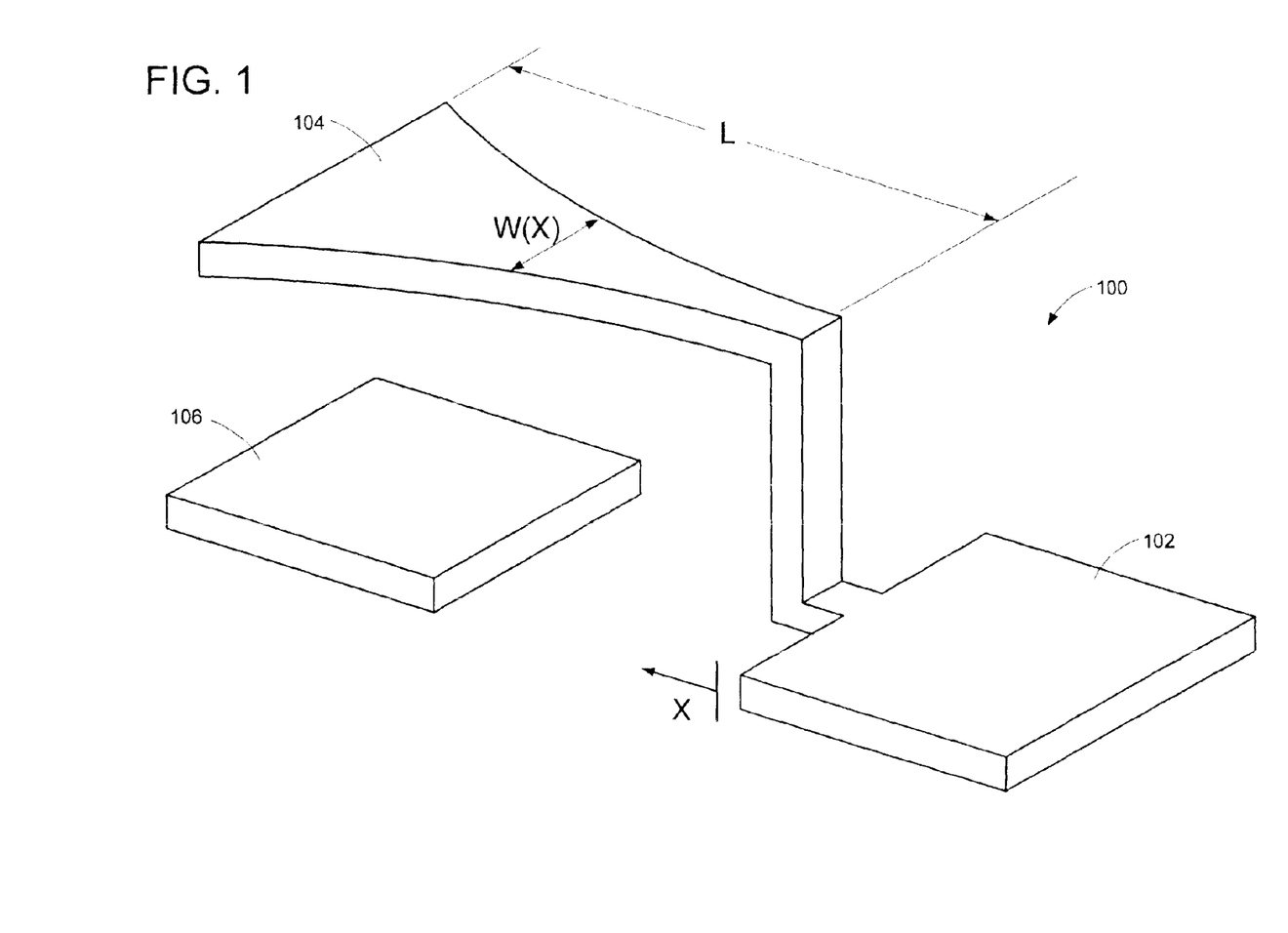
FIG. 1 an isometric view of a tapered-width micro-cantilever in accordance with the teachings of the present invention.

FIG. 1 illustrates a tapered-width micro-cantilever 100. The micro-cantilever 100 has a contact pad 102, cantilever section 104 and actuation or base electrode 106. The width of the cantilever section 104 is a function of the position. For example, a linear-tapered micro-cantilever has a variable width according to the equation $W_0 + ax$ where $W_0$ is initial width of the cantilever section. The governing equation for a tapered-width micro-cantilever as illustrated in FIG. 1 is given as $$\frac{d^2}{dx^2}\left[EI(x)\frac{d^2 v(x)}{dx^2}\right] = q(x) \tag{2}$$

where E is the Young's modulus of the micro-cantilever material, I(x) is the moment of inertia, v(x) is the displacement, and q(x) is the load density at point x. For electrostatic actuation, the load q(x) is $-\epsilon_o w V^2/2[d_o-V(X)]^2$ where w is the width of the cantilever at position x. A finite-difference method with a self-consistent iterative is used to solve equation (2) numerically as explained below.

Figure 2:
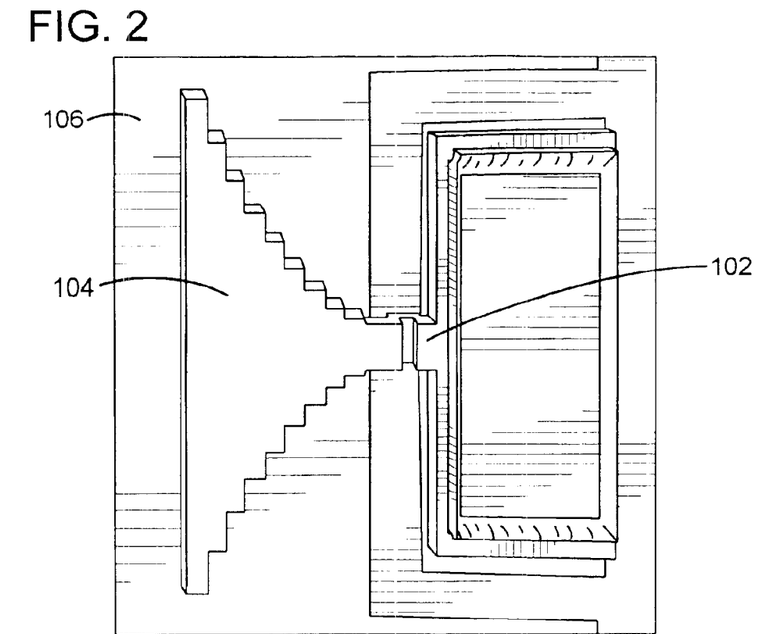
FIG. 2 is an illustration of a linear-tapered width micro-cantilever of the present invention.
Figure 3:
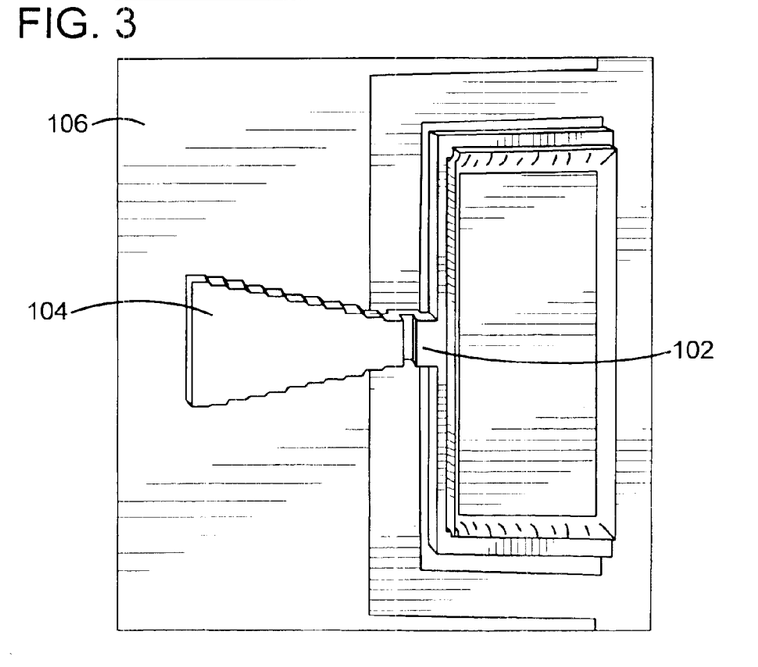
FIG. 3 is an illustration of a parabolic-tapered width micro-cantilever of the present invention.
Figure 4:
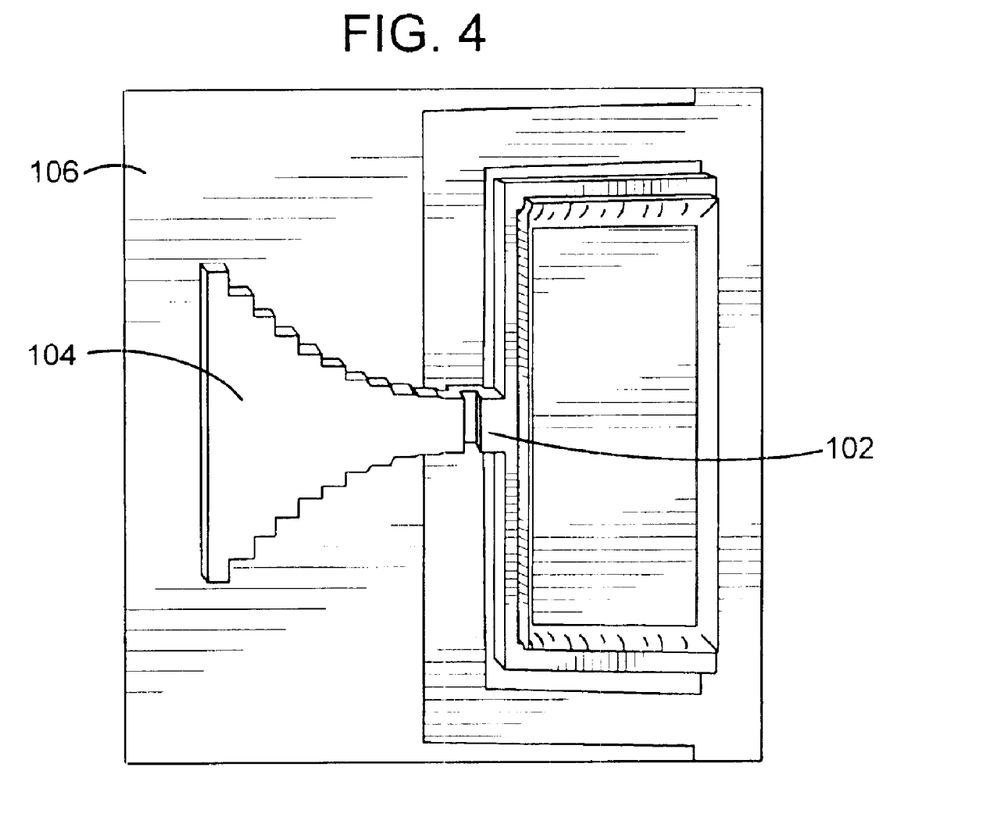
FIG. 4 is an illustration of an exponential-tapered width micro-cantilever of the present invention.

In the description that follows, three types of taper functions will be used to describe the invention. These types are linear, parabolic, and exponential functions. While the three types will be used, it is recognized that other types of taper functions can be used with the invention. A linear-tapered width micro-cantilever is shown in FIG. 2. A parabolic-tapered width micro-cantilever is shown in FIG. 3. An exponential-tapered width micro-cantilever is shown in FIG. 4. The width functions are $w(x)=W_o+ax$, $w(x)=W_o+ax^2$, and $w(x)=W_o \exp(ax)$ for linear, parabolic, and exponential taper functions, respectively, where $W_o$ is the initial width of the cantilever portion 104. Because of the tapered width, the moment of inertia I is a function of position along the length. It is necessary to expand the terms on the left-hand-side of equation (2) as $$2EI'v''' + EI''v'' + EIv. \tag{3}$$

Expanding each term in equation (3) in finite difference form and combining them together with the remaining terms in equation (2), the general finite difference equation can be used to solve any tapered-width cantilever. The equation in finite difference form becomes:

$$EI\frac{v(x+2h) - 4v(x+h) + 6v(x) - 4v(x-h) + v(x-2h)}{h^4} = q(x) \tag{4}$$

where h is the length of each differential element.

Using the boundary conditions of $v(0)=0$, $dv(0)/dx=0$, $d^2v(L)/dx^2=0$, and $d^3v(L)/dx^3=0$, an iterative process is used to solve for v. For example, assembling all the discrete points on the cantilever, equation 4 will form a banded matrix as shown below.

$$\begin{bmatrix} 7 & -4 & 1 & 0 & . & . & . & . & 0 \\ -4 & 6 & -4 & 1 & 0 & & & & . \\ 1 & -4 & 6 & -4 & 1 & . & & & . \\ 0 & . & & & & & & & . \\ . & . & . & & . & & . & & . \\ . & . & & & & . & . & . & 0 \\ . & & & . & 1 & -4 & 6 & -4 & 1 \\ . & & & & . & 1 & -4 & 5 & -2 \\ 0 & . & . & . & . & 0 & 2 & -4 & 2 \end{bmatrix} \begin{bmatrix} v_1 \\ v_2 \\ v_3 \\ . \\ . \\ . \\ v_{N-2} \\ v_{N-1} \\ v_N \end{bmatrix} = -\frac{h^4 \varepsilon_0 V^2}{2EI} \begin{bmatrix} 1/(d_0-v_1)^2 \\ 1/(d_0-v_2)^2 \\ 1/(d_0-v_3)^2 \\ . \\ . \\ . \\ 1/(d_0-v_{N-2}) \\ 1/(d_0-v_{N-1})^2 \\ 1/(d_0-v_N)^2 \end{bmatrix} \tag{5}$$

Since the unknown displacement vector v appears on both sides of equation 5, one iterative process that can be used to solve for v is an iterative relaxation method. One algorithm for this self-consistent iterative process is as follows

```
Initial guess of displacement vector v
While Δv > tolerance
    Solve v₁
    Calculate Δv = v₁ - v_{i-1}
    v_{i+1} = v_i + RΔv
    Obtain new load vector q
End
Solution v,
``` where R is the relaxation constant. A relaxation constant between 0 and 1.9 generally guarantees numerical stability.

Figure 5:
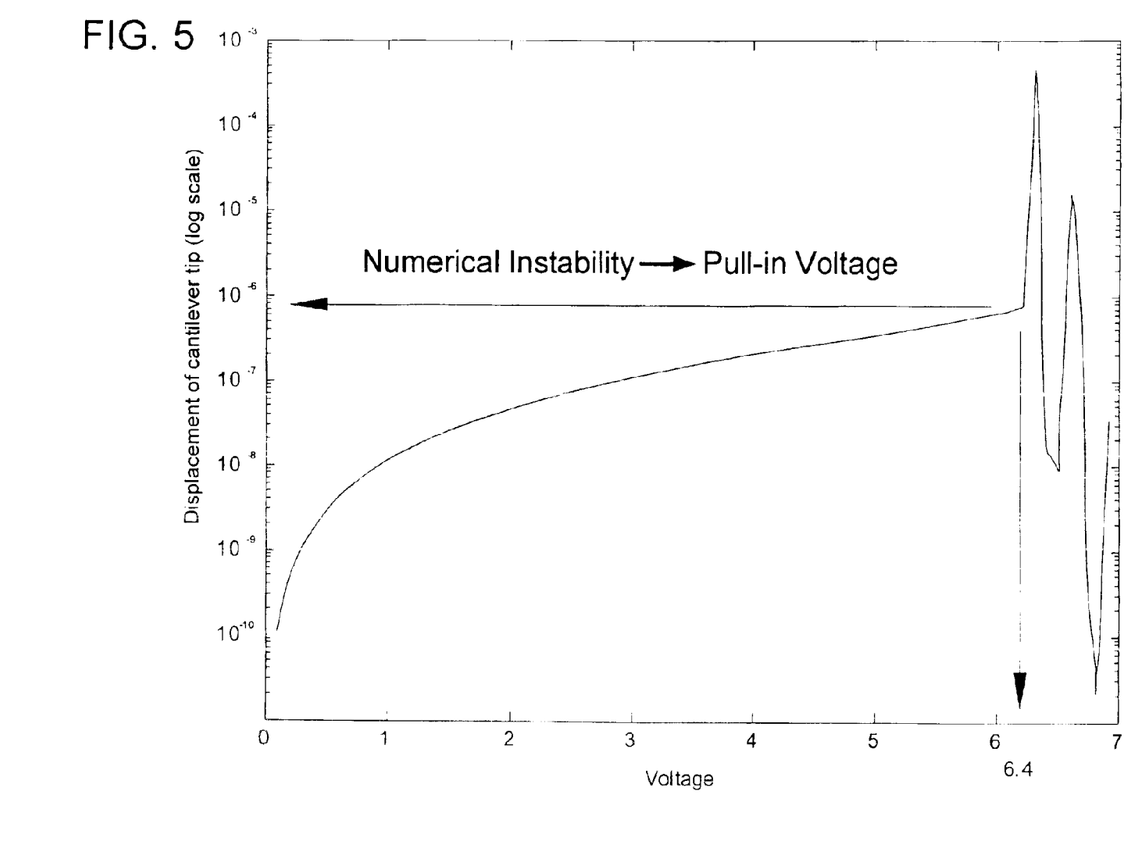
FIG. 5 is a graph illustrating the relationship between pull-in voltage and numerical instability of an iterative solution process.

Since the width is a function of position along the length of a tapered-width micro-cantilever, the first and the second derivatives of moment of inertia are given as $I'(x)=w'(x)t^3/12$ and $I''(x)=w''(x)t^3/12$. By adjusting the coefficient a in each of the three width functions, a designer is able to control how fast the width grows with length. Using the specifications of the structure of the micro-cantilever layer as parameters, the pull-in voltages for these tapered-width micro-cantilevers are calculated as described above. A typical relationship between the gap and the applied voltage across the micro-cantilever and the actuation electrode is shown in FIG. 5 in which the pull-in voltage can be read from the critical point after which a numerical instability occurs. This happens when the solution of the displacement at discrete points does not converge for a voltage greater than the pull-in voltage. In FIG. 5, the critical point is 6.4 V, which means the pull-in voltage of the micro-cantilever is 6.4 V. The cantilever beam of the micro-cantilever whose data is shown in FIG. 5 has dimensions that are 300 um×10 um×2 um. The numerical instability results from zero incremental stiffness of the beam. From these calculated pull-in voltages, fitting formulae are obtained to describe the relationship between the pull-in voltage of a tapered-width micro-cantilever and its geometry.

Figure 6:
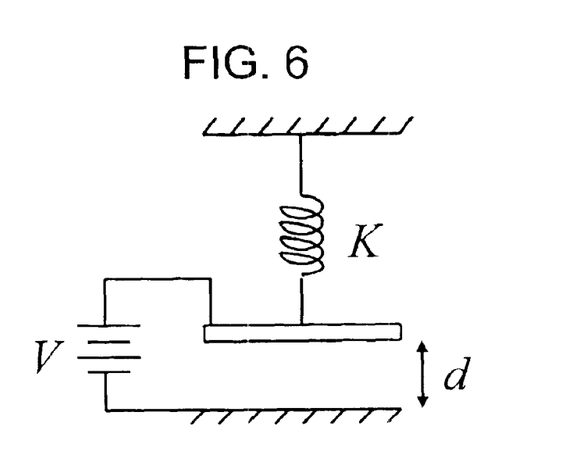
FIG. 6 is an illustration of a lumped mode of a cantilever.

The pull-in voltage can also be derived analytically from the equilibrium between the electrostatic force and the restoring force of the cantilever's lumped model, which is modeled as a spring as shown in FIG. 6. At equilibrium, the net force is zero.

$$\text{Net force} = \frac{\varepsilon_0 A V^2}{2d} - K(d|_{V=0} - d) = 0 \qquad (6)$$

In equation 6, the gap d is a function of the applied voltage V. There exists a maximum value of applied voltage $V_P$ beyond which the restoring force fails to maintain equilibrium, and the spacing immediately goes to zero. Setting the derivative of equation 6 equal to zero shows that the pull-in voltage $V_P = V_{PI}$ when $d = 2d_0/3$ ($d|_{v=0} = d_0$). From equation 6

$$V_{PI} = \sqrt{\frac{8 K d_0^3}{27 \varepsilon_0 A}} \qquad (7)$$

Using equation 7, the spring constant K is calculated from a known pull-in voltage and the geometry of the cantilever. Since the pull-in phenomenon is a sharp event, $V_{PI}$ can be determined with good accuracy. Considering the fringing field effect, equation 7 can be corrected to first order to be $$V_{PI} = \sqrt{\frac{8 K d_0^3}{27 \varepsilon_0 A \left[1 + 0.42 \frac{d_0}{w}\right]}} \qquad (8)$$

Figure 7:
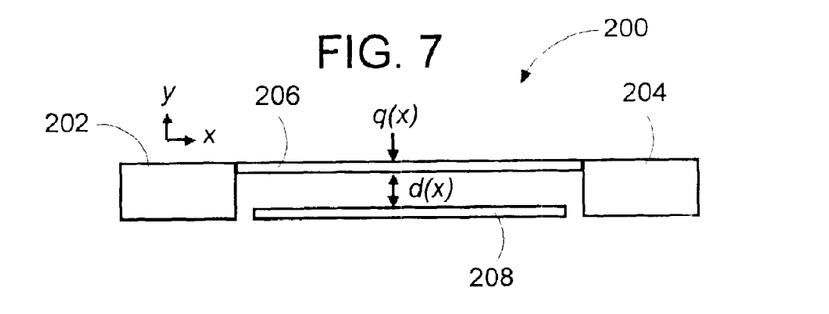
FIG. 7 is a cross-sectional view of the micro-bridge of the present invention.

Now that the methods to derive pull-in voltage for micro-cantilevers have been described, the method to derive pull-in voltage for micro-bridges shall be described. A cross-sectional view of a bridge structure 200 is shown in FIG. 7. The structure 200 has contact pads 202, 204 connecting bridge 206. The bridge 206 is typically over a ground plane 208. It is recognized that the bridge 206 may have different structures underneath it, depending on the application. Since both ends of a bridge or fixed-end beam structure are fixed, any residual stress within the beam will affect the deflection. A fourth-order differential equation describes the deflection of the structure.

$$EI \frac{d^4 v(x)}{dx^4} - T \frac{d^2 v(x)}{dx^2} = q(x) \qquad (9)$$

where T is equal to $\bar{\sigma}$ wt, t is the thickness of the beam and $\bar{\sigma}$ is the stress in the beam. The pull-in voltage is hence dependent on the stress. Equation 9 can also be solved by the finite difference method with boundary conditions v(0)=0, dv(0)/dx=0, v(L)=0, dv(L)/dx=0. For the second term on the left-hand-side of equation 9, the finite difference form that is to be combined with the finite difference form of the first term as described above is shown below.

$$T \frac{v(x+h) - 2v(x) - v(x-h)}{h^2} \qquad (10)$$

The same iterative procedure for solving for the cantilever's displacement vector v is used to solve the displacement along the beam.

Now that the methods used to calculate pull-in voltages have been described, the, manufacturing process used in one embodiment shall be described. Micro-cantilevers and micro-bridges can be manufactured using any manufacturing process that is available to a designer that meets the requirements for a particular application. For example, the Multi-User MEMS (Micro-Electro-Mechanical Systems) Processes (MUMPS) is a cost-effective approach for low volume applications. One drawback of MUMPS is that the thickness of layers is generally fixed. The fixed thickness eliminates thickness as a design parameter. For higher volumes, other techniques can be used such as the processes used to manufacture semi-conductors.

Figure 8A:
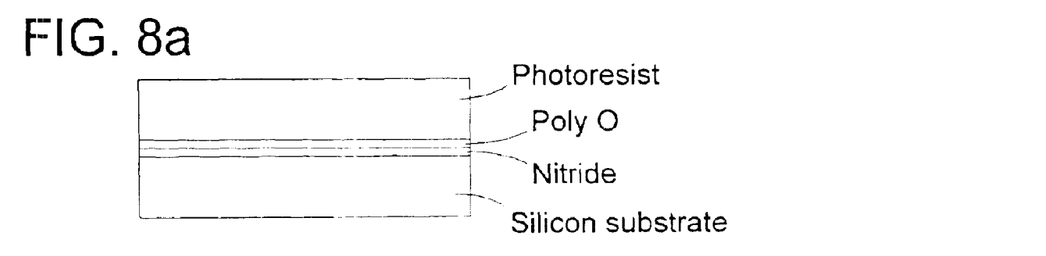
FIGS. 8a–8m illustrate an embodiment of the manufacturing steps to create a micro-cantilever.
Figure 8B:
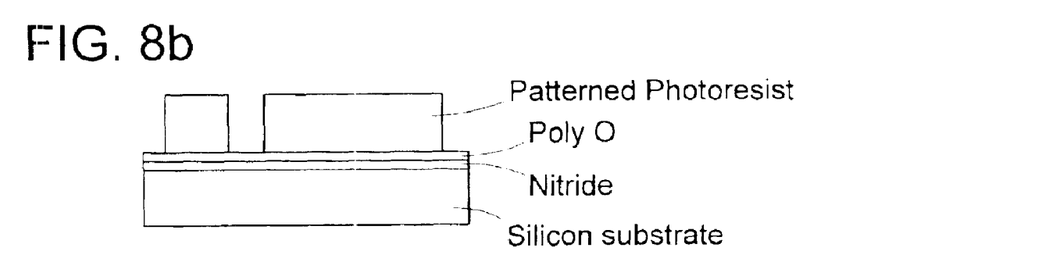
Figure 8C:
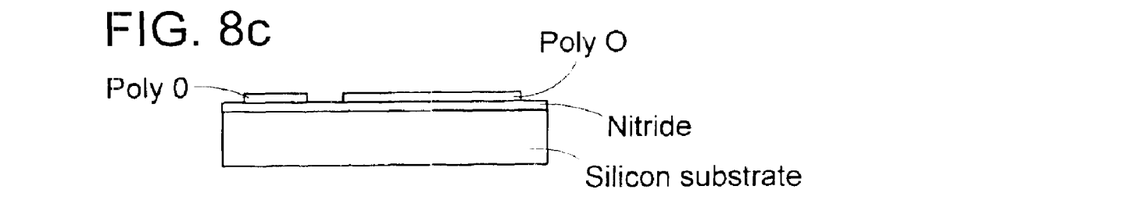
Figure 8D:
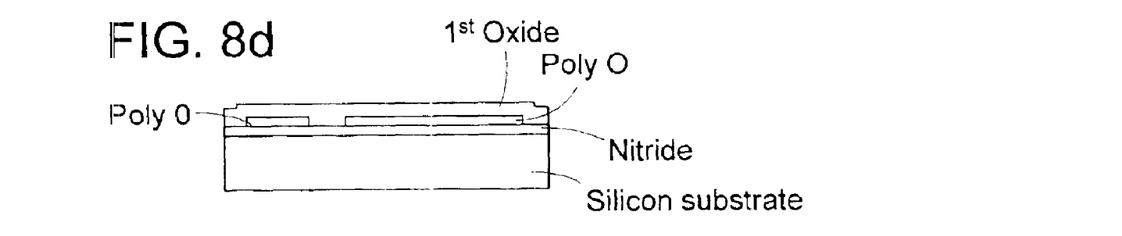
Figure 8E:
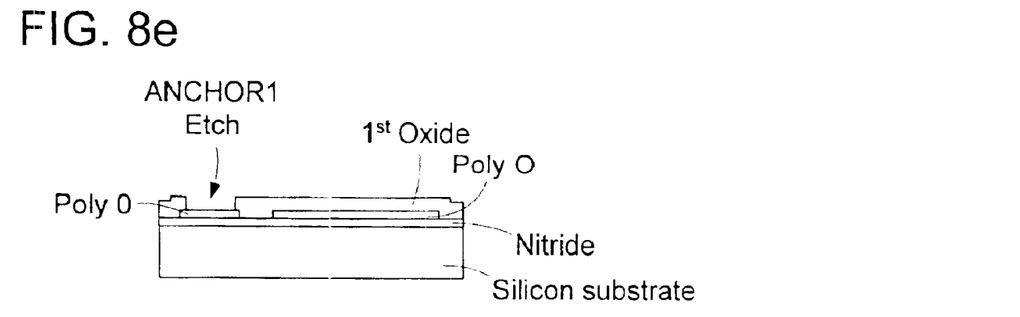

The MUMPS process is three-layer polysilicon surface micromachining process. The process begins with 100 mm n-type (100) silicon wafers of nominally 1–2 Ohm-cm resistivity as a base. The surfaces of the wafers are first heavily doped with Phosphorus in a diffusion furnace using $POCl_3$ as the dopant source. This helps to reduce or prevent charge feedthrough to the substrate from electrostatic devices on the surface. A 600 nm low-stress LPCVD silicon nitride is then deposited on the wafers as an electrical isolation layer. This is followed directly by the deposition of a 500 nm LPCVD polysilicon film (i.e., Poly 0). Poly 0 is then patterned by photolithography, which is a process that includes the coating of the wafers with photoresist (FIG. 8a), exposure of the photoresist with the appropriate mask and developing the exposed photoresist to create the desired etched mask for subsequent pattern transfer into the underlying layer (FIG. 8b). After patterning the photoresist, the Poly 0 layer is then etched in an RIE (Reactive Ion Etch) system (FIG. 8c). A 2.0 μm phosphosilicate glass (PSG) sacrificial layer is then deposited by LPCVD (FIG. 8d). This layer of PSG, known as first oxide, is removed at the end of the process to free the first mechanical layer of polysilicon. The wafers are then patterned with the second mask, ANCHOR1, and reactive ion etched (FIG. 8e). This step provides anchor holes that will be filled by the Poly 1 layer.

Figure 8F:
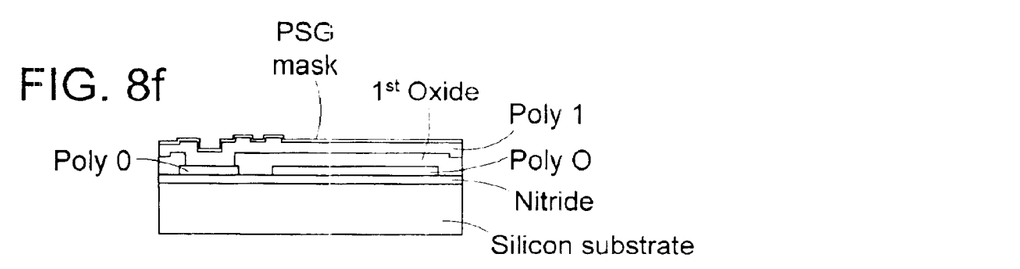
Figure 8G:
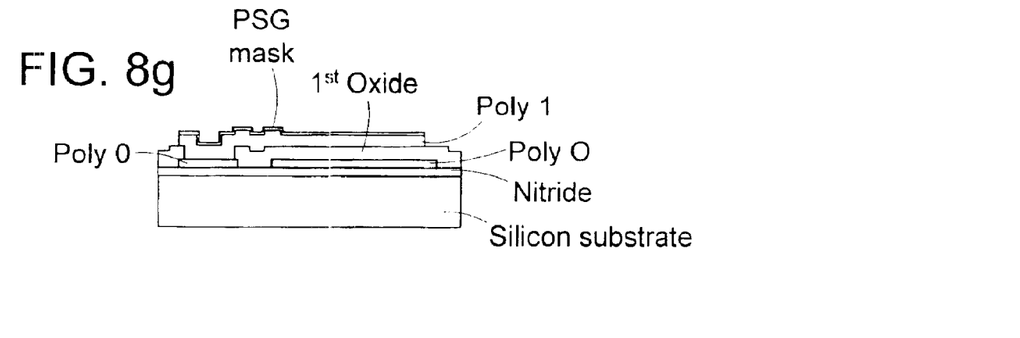

After etching ANCHOR1, the first structure layer of polysilicon (Poly 1) is deposited at a thickness of 2.0μm. A thin (200 nm) layer of PSG is deposited over the polysilicon and the wafer is annealed at 1050° C. for 1 hour (FIG. 8f). The annealing dopes the polysilicon with phosphorus from the PSG layers both above and below it. The annealing also serves to significantly reduce the net stress in the Poly 1 layer. The polysilicon layer (and its PSG masking layer) is lithographically patterned using a mask designed to form the first structural layer Poly 1. The PSG layer is etched to produce a hard mask for the subsequent polysilicon etch. The hard mask is more resistant to the polysilicon etch chemistry than the photoresist and ensures better transfer of the pattern into the polysilicon. After etching the polysilicon (FIG. 8g), the photoresist is stripped and the remaining oxide hard mask is removed by RIE.

Figure 8H:
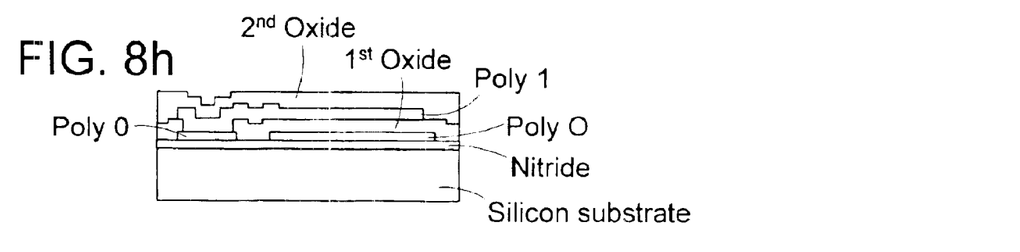
Figure 8I:
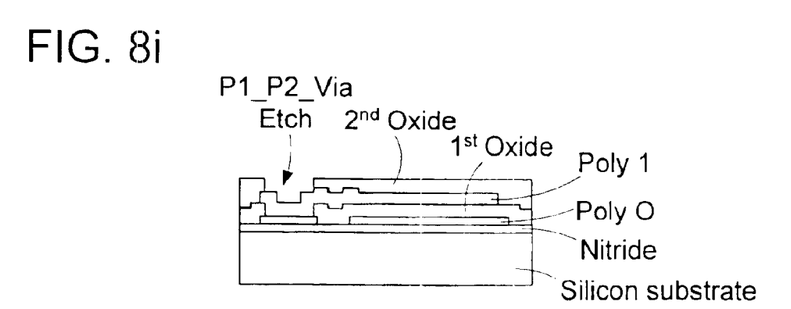

After Poly 1 is etched, a second PSG layer (second oxide) is deposited (FIG. 8h). The second oxide is patterned using two different etch masks with different objectives. A POLY1_POLY2_VIA level provides for etch holes in the second oxide down to the Poly 1 layer. This provides a mechanical and electrical connection between Poly 1 and Poly 2 layers. The POLY1_POLY2_VIA layer is lithographically patterned and etched by RIE (FIG. 8i). The ANCHOR2 level is provided to etch both the first and second oxide layers in one step, thereby eliminating any misalignment between separately etched holes. More importantly, the ANCHOR2 etch eliminates the need to make a cut in first oxide unrelated to anchoring a Poly 1 structure, which needlessly exposes the substrate to subsequent processing that can damage either Poly 0 or nitride. The ANCHOR2 layer is lithographically patterned and etched by RIE in the same way as the POLY1_POLY2_VIA layer.

Figure 8J:
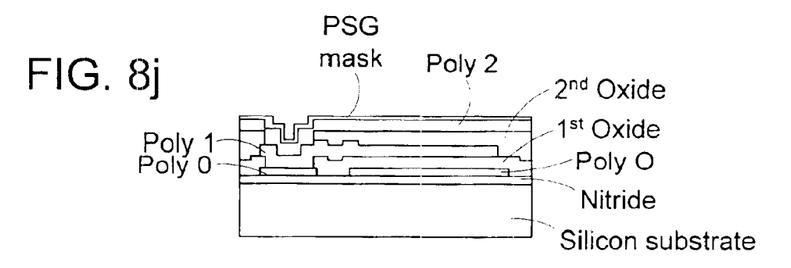
Figure 8K:
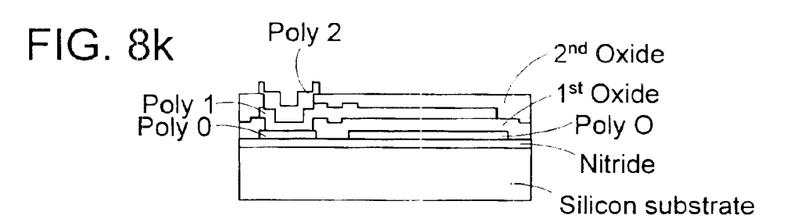

The second structure layer, Poly 2, is then deposited (1.5 µm thick) followed by the deposition of 200 nm PSG. As with Poly 1, a thin PSG layer acts as both an etch mask and dopant source for Poly 2 (FIG. 8j). The wafer is annealed for one hour at 1050° C. to dope the polysilicon and reduce the residual film stress. The Poly2 layer is lithographically patterned with the seventh mask (POLY 2) and the PSG and the polysilicon layers are etched by RIE using the same processing conditions as for Poly 1. The photoresist then is stripped and the masking oxide is removed (FIG. 8k).

Figure 8L:
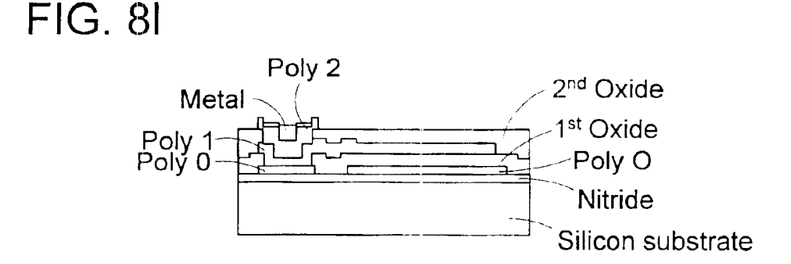
Figure 8M:
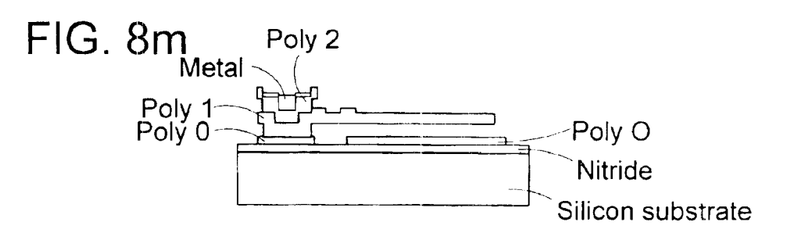

The final deposited layer in the MUMPs process is a 0.5 µm metal layer that provides for probing, bonding, electrical routing and highly reflective mirror surfaces. The wafer is patterned lithographically with the eighth mask (METAL) and the metal is deposited and patterned using lift-off. The final, unreleased structure is shown in FIG. 8l. FIG. 8m shows the device after sacrificial oxide release. The release is performed by immersing the chip in a bath of 49% HF (room temperature) for 1.5–2 minutes. This is followed by several minutes in DI water and then alcohol to reduce stiction followed by at least 10 minutes in an oven at 110° C. Micro-bridges can be manufactured using the same process.

Figure 9A:
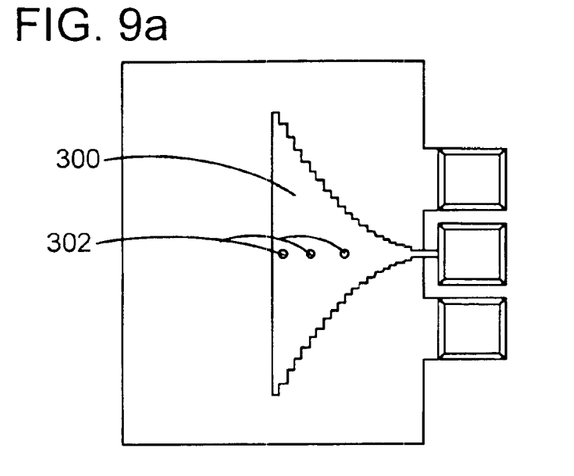
FIG. 9a is an illustration of a micro-cantilever having open windows in accordance with the teachings of the present invention.
Figure 9B:
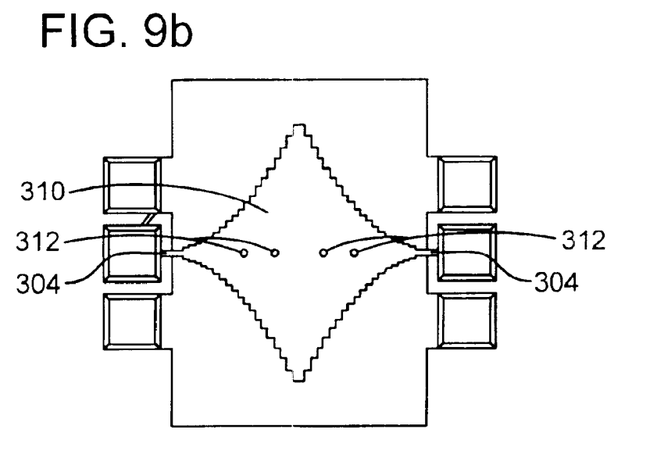
FIG. 9b is an illustration of a micro-bridge having open windows in accordance with the teachings of the present invention.

Stiction of devices is common problem. Stiction occurs when layers that are designed to be moved bond with a fixed layer during the drying process due primarily to capillary forces. One way to minimize this effect is to dry the chips after HF release by critical point drying in $CO_2$. HF release followed by supercritical $CO_2$ drying was used to release and dry our chips to minimize the probability of stiction. In order to avoid the stiction problem, the length to width ratio for cantilevers and the area of the cantilever should be kept as small as possible. If a large area is needed for an application, scattered open windows on the movable structures can be used to reduce the capillary force. The use of scattered open windows also reduces the damping effect of air whenever the cantilever structure vibrates if the cantilever operates in air. FIG. 9a illustrates the use of scattered open windows 302 in a tapered-width micro-cantilever 300. FIG. 9b illustrates scattered windows 312 in a tapered-width micro-bridge 310.

Now that one method of manufacturing micro-cantilevers has been described, the equations for the three types of micro-cantilevers shall be described. As previously indicated, fitting formulae are obtained to describe the relationship between the pull-in voltage of a tapered-width micro-cantilever and its geometry from the calculated pull-in voltages. This is done in one embodiment as follows. For a linear-tapered-width micro-cantilever, the pull-in voltage is assumed to have the form $$V_{PI} = ka^x w_0^y L^z$$

where a is the slope of the taper function, $w_0$ is the initial width and L is the length. Note that for manufacturing processes where thickness can be varied, the pull-in voltage may have a thickness variable if the data indicates the pull-in voltage is a function of thickness. From the calculated pull-in voltage at various lengths, the fitted formula for the linear-tapered-width cantilever taking into account the Young's modulus is derived to be $$V_{PI} = 1.5 \times 10^{-12} a^{-0.2009} L^{-2.1899} w_0^{0.2166} \sqrt{E}$$

The pull-in voltages of parabolic-tapered, and exponential-tapered micro-cantilevers were also used to extract the empirical formulae describing the relationship between the design parameters and their pull-in voltages using the same process as above. Using the material and thickness parameters of the cantilever, the empirical formulae for the pull-in voltages are shown in Table 1. Note that numerical calculations indicate that the pull-in voltage for an exponential-tapered width micro-cantilever is a very weak function of the initial width. While the pull-in voltage could be assumed to be a function of the initial width, the pull-in voltage is assumed to be of the form $V_{PI} = ke^{ax} L^y$. The material and thickness of the micro-cantilevers of table 1 are based on the Multi-User MEMS Processes used to manufacture the micro-cantilevers. It is clear that the pull-in voltage of a micro-cantilever is not only a function of length, but is also a function of the initial width and taper function along its length. Once the formulae for a particular manufacturing technology are derived, a designer can easily obtain the desired pull-in voltage by adjusting design parameters.

TABLE 1

| Taper function | Empirical formulae for the pull-in voltages |
|---|---|
| Linear | $V_{PI} = 1.5 \times 10^{-12} a^{-0.2009} L^{-2.1899} w_0^{0.2166} \sqrt{E}$ |
| Parabolic | $V_{PI} = 3.2626 \times 10^{-13} a^{(-0.3385 + 76.4667L)} L^{-2.8044} w_0^{0.3219} \sqrt{E}$ |
| exponential | $V_{PI} = 1.0021 \times 10^{-11} \sqrt{E} L^{-1.7868} \exp[a(1.01469 \times 10^{-5} - 0.4221L)]$ |

Figure 10:
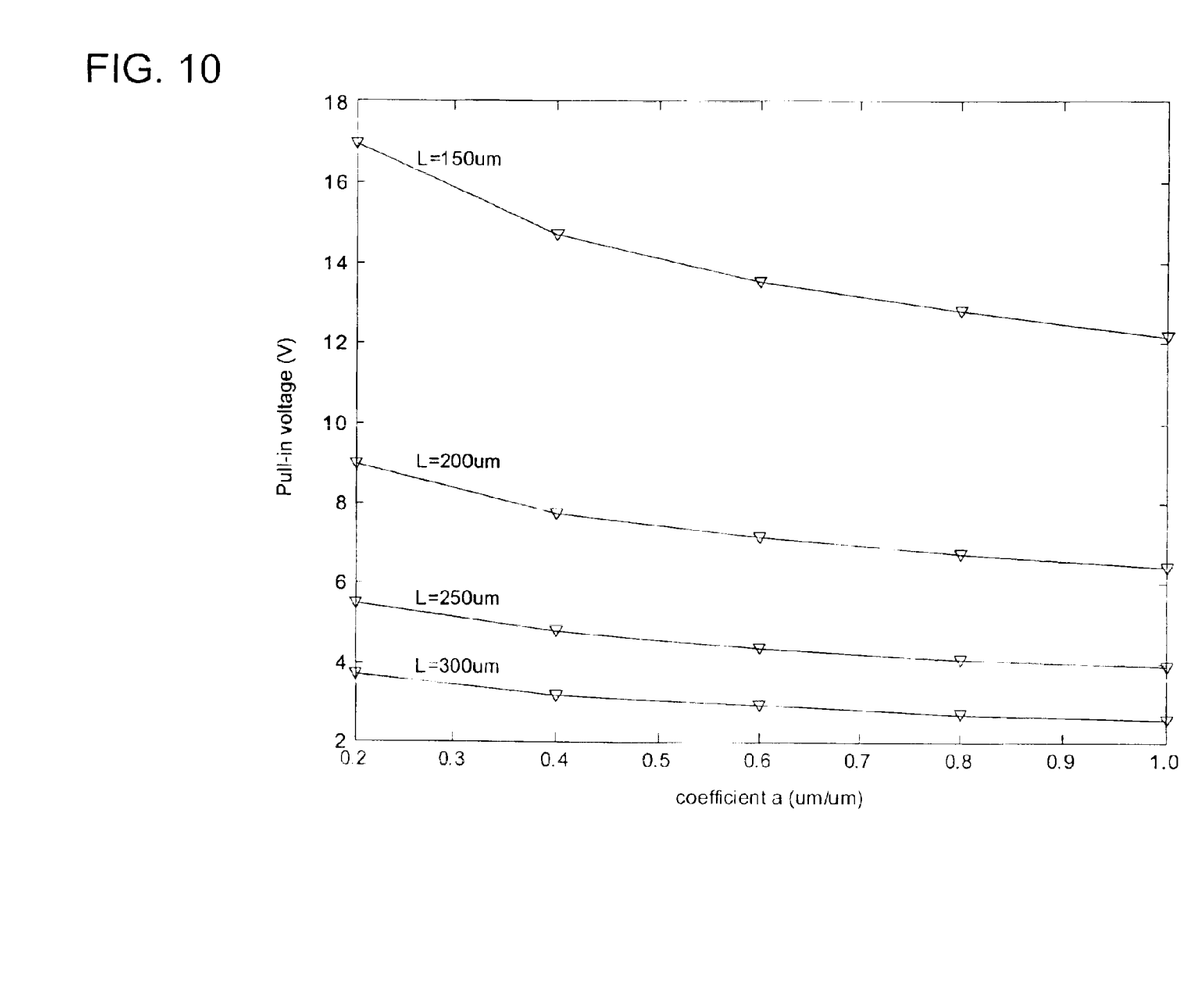
FIG. 10 is a graph illustrating the calculated and measured pull-in voltages of linear-tapered micro-cantilevers as a function of taper slope.
Figure 11:
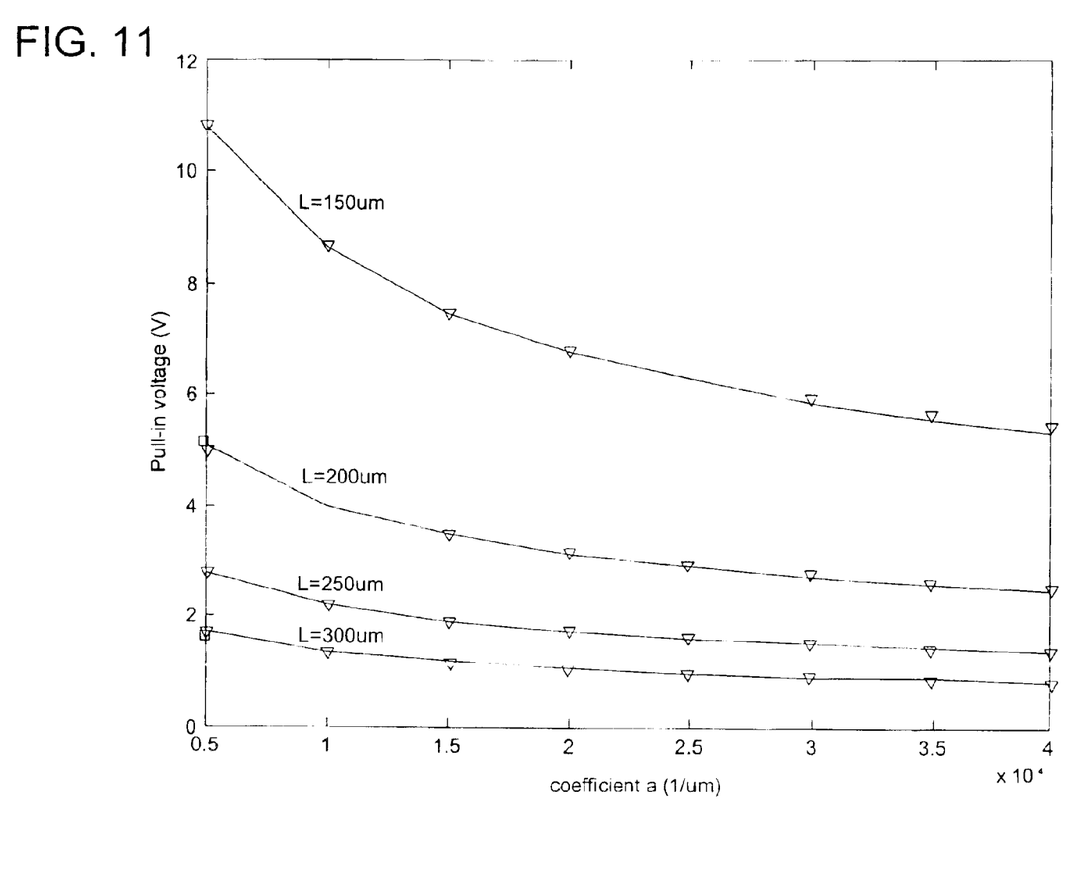
FIG. 11 is a graph illustrating the calculated and measured pull-in voltages of parabolic-tapered micro-cantilevers as a function of taper slope.
Figure 12:
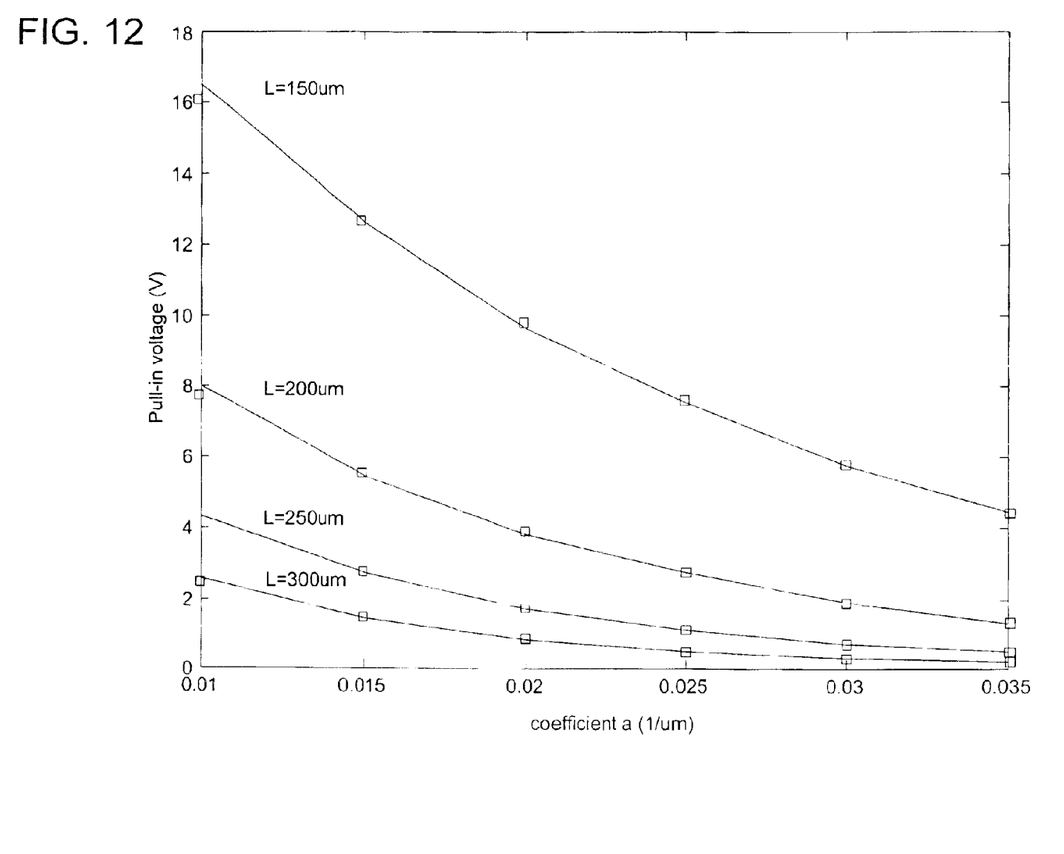
FIG. 12 is a graph illustrating the calculated and measured pull-in voltages of linear-tapered micro-cantilevers as a function of taper coefficient.

Several tapered-width micro-cantilevers with different design parameters were designed and fabricated by the MUMPS process as described above. Simple micro-cantilevers with different lengths were used to extract the Young's modulus of the material (polysilicon) whose mean value is 175 GPa, which is closed to the reported value 170 GPa, with a standard deviation 40 GPa. The calculated and measured values of pull-in voltages are shown in FIG. 10, FIG. 11, and FIG. 12 for each type of micro-cantilever. In FIGS. 10–12, the triangular dots are measured values and the solid lines are the derived formula as described above. As shown in the figures, pull-in voltages decrease as the taper slope/coefficient a and the micro-cantilever length increases. An interesting trend is that as the taper coefficient a increases, to some extent the pull-in voltage is relatively insensitive to it and approaches an asymptotic value.

Figure 9C:
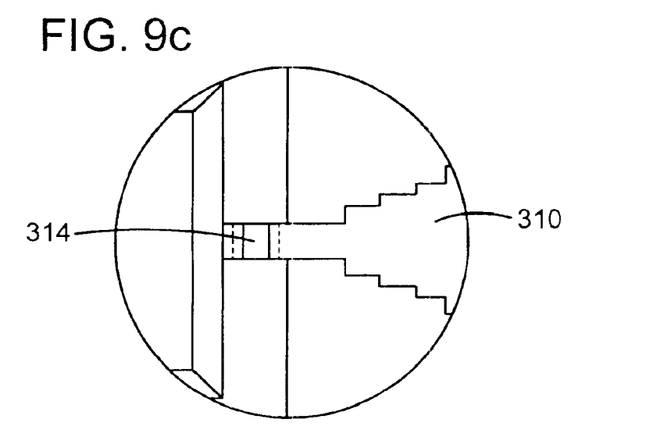
FIG. 9c is an illustration of the micro-bridge of FIG. 9b illustrating the strain relief in accordance with the teachings of the present invention.

One problem that may occur with tapered-width micro-bridges is the large area of the bridge in relation to the starting width of the bridge. The weight of the bridge may cause undue stress and/or strain at the start of the bridge (i.e., the pinion). On way to reduce the problem is to provide lateral stress relief such as those found in gyros or windows 312 (see FIGS. 9a and 9b). Additionally, adding a strain relief (see 314 in FIG. 9c) to the pinion ends reduces the strain on the micro-bridge.

Tapered-width micro-cantilevers and micro-bridges have been described. These devices provide additional design parameters for controlling and synthesizing pull-in voltages. The design parameters include initial width and the taper coefficient of a chosen taper function. The additional design parameters give designers more design space for controlling the pull-in voltage of a micro-cantilever. With a tapered-width, a micro-cantilever with a moderate area can have a very low pull-in voltage, which is very desirable for low voltage applications. Generally, a fast growing width along the length has a smaller pull-in voltage but consumes more area. For high frequency applications, the tapered width might be limited to a slow-growing function due to the requirement of low reflection. Metal such as gold, copper, and aluminum should be used as the material of the micro-cantilever switch for the requirement of low insertion loss for high frequency applications. A non-linear tapered-width micro-cantilever may also be designed using the teachings of the present invention. For example, a micro-cantilever or micro-bridge having a sinusoidal function, a stepped function, a trapezoid function or the like along the tapered-width can be designed using the teachings of the present invention. Other functions may also be used.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of any ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variation thereof is encompassed by the invention unless otherwise indicated herein or otherwise clearly contradicted by context.

What is claimed is:

1. A micro-cantilever device comprising:
    a base section;
    a cantilever section having a length and a tapered width along the length, the cantilever section connected to the base section, the tapered width a function of position along the length and having a minimum width at the base section.

2. The micro-cantilever device of claim 1 wherein the function is defined by tapered width=$w_0$+ax, wherein $w_0$ is an initial width of the cantilever section proximate the base section, a is a coefficient, and x is a position along the length of the cantilever section.

3. The micro-cantilever device of claim 1 wherein the function is defined by tapered width=$w_0$+ax$^2$, wherein $w_0$ is an initial width of the cantilever section proximate the base section, a is a coefficient, and x is a position along the length of the cantilever section.

4. The micro-cantilever device of claim 1 wherein the function is defined by tapered width=$w_0$+ax$^3$, wherein $w_0$ is an initial width of the cantilever section proximate the base section, a is a coefficient, and x is a position along the length of the cantilever section.

5. The micro-cantilever device of claim 1 wherein the function is defined by tapered width=$w_0$*exp(ax), wherein $w_0$ is an initial width of the cantilever section proximate the base section, a is a coefficient, and x is a position along the length of the cantilever section.

6. The micro-cantilever device of claim 1 wherein the function is defined by tapered width=$w_0$+ax+bx$^2$, wherein $w_0$ is an initial width of the cantilever section proximate the base section, a is a coefficient, b is a second coefficient and x is a position along the length of the cantilever section.

7. The micro-cantilever device of claim 1 wherein the function is defined by tapered width=$w_0$+ax+bx$^2$+cx$^3$, wherein $w_0$ is an initial width of the cantilever section proximate the base section, a is a coefficient, b is a second coefficient, c is a third coefficient, and x is a position along the length of the cantilever section.

8. The micro-cantilever device of claim 1 further comprising a ground plane below a portion of the cantilever section.

9. The micro-cantilever device of claim 1 wherein the micro-cantilever has a pull-in voltage that is calculated as function of dimensions of the cantilever section and material properties of the cantilever section.

10. The micro-cantilever device of claim 9 wherein the function is substantially defined by $V_{PI}=1.5\times10^{-12}a^{-0.2009}L^{-2.1899}w_0^{0.2166}\sqrt{E}$, wherein $V_{PI}$ is the pull-in voltage, a is a slope of the tapered width, L is the length, and E is the Young's modulus.

11. The micro-cantilever device of claim 9 wherein the function is substantially defined by $V_{PI}=3.2626\times10^{-13}a^{(-0.3385+76.4667L)}L^{-2.8044}w_0^{0.3219}\sqrt{E}$, wherein $V_{PI}$ is the pull-in voltage, a is a taper coefficient, L is the length, and E is the Young's modulus.

12. The micro-cantilever device of claim 9 wherein the function is substantially defined by $V_{PI}=1.0021\times10^{-11}\sqrt{EL}^{-1.7868}\exp[a(1.01469\times10^{-5}-0.4221L)]$, wherein $V_{PI}$ is the pull-in voltage, a is a taper coefficient, L is the length, and E is the Young's modulus.

13. The micro-cantilever device of claim 9 wherein the function is derived by performing the steps of:
    determining a geometry of the micro-cantilever device;
    determining a plurality of pull-in voltages for at least one length of the micro-cantilever device; and
    fitting a pull-in voltage formula to the plurality of pull-in voltages based upon the geometry of the micro-cantilever device.

14. The micro-cantilever device of claim 13 further comprising the step of assuming a form of the pull-in voltage formula.

15. The micro-cantilever device of claim 14 wherein the form of the pull-in voltage is $V_{PI}=ka^xw_0^yL^z$ if the micro-cantilever device has one of a linear tapered width and a parabolic tapered width, wherein $V_{PI}$ is the pull-in voltage, k is a constant, a is a slope of the tapered width, and L is the length.

16. The micro-cantilever device of claim 14 wherein the form of the pull-in voltage is $V_{PI}=ke^{ax} L^y$ if the micro-cantilever device has an exponential tapered width, wherein $V_{PI}$ is the pull-in voltage, k is a constant, a is a taper coefficient, and L is the length.

17. The micro-cantilever device of claim 1 wherein the cantilever section has at least one open window.

18. The micro-cantilever device of claim 17 wherein the micro-cantilever device has an axis about which the micro-cantilever device is symmetrical and wherein the at least one open window is located on the axis.

19. The micro-cantilever device of claim 1 further comprising a second base section and wherein the cantilever section is attached to the second base section.

20. The micro-cantilever device of claim 19 further comprising a ground plane located below the cantilever section.

21. The micro-cantilever device of claim 19 wherein the cantilever section has at least one open window.

22. The micro-cantilever device of claim 19 further comprising a strain relief at at least one of the base section and second base section.

23. The micro-cantilever device of claim 19 wherein the cantilever section includes a lateral stress relief.

24. The micro-cantilever device of claim 1 wherein the micro-cantilever device is manufactured using a Multi-User Micro-Electro-Mechanical Systems Process.

25. The micro-cantilever device of claim 1 wherein the tapered width is a function of position along the length and one of a sinusoidal function, a stepped function, and a trapezoidal function.

26. A method to determine a pull-in voltage formula of a micro-cantilever device comprising the steps of:

determining a geometry of the micro-cantilever device;

determining a plurality of pull-in voltages for a plurality of lengths of the micro-cantilever device; and fitting a pull-in voltage formula to the plurality of pull-in voltages based upon the geometry of the micro-cantilever device.

27. The micro-cantilever device of claim 26 further comprising the step of assuming a form of the pull-in voltage formula.

28. The micro-cantilever device of claim 27 wherein the form of the pull-in voltage is $V_{PI}=ka^x w_0^y L^z$ if the micro-cantilever device has one of a linear tapered width and a parabolic tapered width, wherein $V_{PI}$ is the pull-in voltage, k is a constant, a is a slope of the tapered width, and L is the length.

29. The micro-cantilever device of claim 27 wherein the form of the pull-in voltage is $V_{PI}=ke^{ax}L^y$ if the micro-cantilever device has an exponential tapered width, wherein $V_{PI}$ is the pull-in voltage, k is a constant, a is a taper coefficient, and L is the length.

30. The method of claim 26 wherein the step of determining a plurality of pull-in voltages for a plurality of lengths of the micro-cantilever device comprises the steps of:

a) iteratively solving a displacement vector as a function of applied voltage across the micro-cantilever device;

b) determining a voltage at which a solution of the displacement vector does not converge;

c) setting a pull-in voltage to the voltage at which the solution did not converge; and d) repeating steps a–c for a number of slope constants.

31. The method of claim 30 further comprising the step of repeating steps a–d for each length.

* * * * *